United States Patent [19]
de Lyon

[11] Patent Number: 5,306,386
[45] Date of Patent: Apr. 26, 1994

[54] ARSENIC PASSIVATION FOR EPITAXIAL DEPOSITION OF TERNARY CHALCOGENIDE SEMICONDUCTOR FILMS ONTO SILICON SUBSTRATES

[75] Inventor: Terence J. de Lyon, Newbury Park, Calif.

[73] Assignee: Hughes Aircraft Company, Los Angeles, Calif.

[21] Appl. No.: 43,644

[22] Filed: Apr. 6, 1993

[51] Int. Cl.$^5$ ............................................. C30B 25/02
[52] U.S. Cl. ......................................... 156/612; 437/2; 437/105; 437/107; 437/126; 148/DIG. 64
[58] Field of Search .................... 437/2, 3, 129, 133, 437/105, 107, 126, 965; 156/610, 612; 148/DIG. 64

[56] References Cited

U.S. PATENT DOCUMENTS

| | | | |
|---|---|---|---|
| 3,729,341 | 4/1973 | Dietz et al. | 437/126 |
| 4,910,154 | 3/1990 | Zanio et al. | 437/3 |
| 4,931,132 | 6/1990 | Aspnes et al. | 156/610 |
| 5,013,685 | 5/1991 | Chiu et al. | 437/105 |
| 5,021,360 | 6/1991 | Melman et al. | 437/105 |
| 5,028,561 | 7/1991 | Kamath et al. | 437/105 |
| 5,136,347 | 8/1992 | Nishimura | 437/105 |

OTHER PUBLICATIONS

A. N. Tiwari, et al, "Heteroepitaxy of CdTe(100) on Si(100) Using BaF$_2$-CaF$_2$(100) Buffer Layers", in *Journal of Crystal Growth*, vol 111, pp. 730-735 (1991).

R. Sporken, et al, "Current Status of Direct Growth of CdTe and HgCdTe on Silicon by Molecular Beam Epitaxy", in *Journal of Vacuum Science and Technology*, B 10 pp. 1405-1409 (1992).

S. M. Johnson et al, "MOCVD Grown CdZnTe/GaAs/Si Substrates for Large-Area HgCdTe IRFPAs", in *1992 HGCDTE Workshop*, Boston, Mass., Oct. 13-15, 1992).

S. M. Johnson, et al, "Structural and Electrical Properties of Heteroepitaxial HgCdTe/CdZnTe/GaAs/Si", in *Materials Reaserch Society Symposium Proceedings*, vol. 161, pp. 351-356 (1990).

R. D. Bringans et al, "initial Stages of Growth of ZnSe on Si", in *Materials Research Society Symposium Proceedings*, vol. 242, pp. 191-202 (1992).

R. D. Bringans et al, "Effect of Interface Chemistry on the Growth of ZnSe on the Si (100) Surface", in *Physical Review B*, vol. 45, No. 23, pp. 13,400-13,406 (15 Jun. 1992).

Primary Examiner—Robert Kuncmund
Assistant Examiner—Ramamohan Rao Paladugu
Attorney, Agent, or Firm—V. D. Duraiswamy; W. K. Denson-Low

[57] ABSTRACT

Ternary II-VI semiconductor films (16) are formed on a silicon substrate (12) by first depositing a monolayer of arsenic (14) or other Group V metal on a cleaned surface of the substrate. The ternary II-VI semiconductor film is then formed over the arsenic monolayer, either directly thereon or on top of an intermediate II-VI semiconductor buffer layer (18). The use of an arsenic passivating layer facilitates the epitaxial deposition of technologically important II-VI semiconductors such as ZnTe, CdTe, and HgCdTe on silicon substrates of arbitrary crystallographic orientation.

4 Claims, 1 Drawing Sheet

ARSENIC PASSIVATION FOR EPITAXIAL DEPOSITION OF TERNARY CHALCOGENIDE SEMICONDUCTOR FILMS ONTO SILICON SUBSTRATES

BACKGROUND OF THE INVENTION

1. Field of the Invention

The present invention relates to the deposition of II-VI semiconductor films, and, more particularly, to the deposition of ternary chalcogenide semiconductor films, such as HgCdTe and HgZnTe, onto silicon substrates.

2. Description of Related Art

Ternary II-VI semiconductor films find use in many infra-red applications, such as in IR focal plane arrays (FPAs). Examples of such ternary II-VI semiconductor compounds include HgCdTe and HgZnTe, which are also known as chalcogenides.

In the past, ternary II-VI semiconductors were formed on ternary II-VI substrates, such as CdZnTe, which were then bonded to silicon substrates by indium bump technology. However, the thermal cycling to 77 K, which is the temperature used for detection, has tended to create reliability problems. It is desired to use silicon-based substrates rather than bulk CdZnTe substrates for large area focal plane arrays, since the readout circuit chips are also silicon, and thus expansion and contraction with thermal cycling would be at the same rate.

A variety of approaches have been tried to form II-VI films on silicon. Prior methods of depositing II-VI films on Si substrates fall into two categories: (1) those employing an intervening buffer layer, usually GaAs or a Group II fluoride such as $CaF_2$ or $BaF_2$, between the Si substrate and the II-VI layer; and (2) those that deposit the II-VI film directly on the Si substrate with no intentional placement of any intervening layers. However, for the most part, various buffer layers have been used, due to the disparity of lattice parameters between silicon and the II-VI semiconductor film, which often is of the order of 15% to 20%.

Group II fluoride buffer layers on silicon have been used, with the II-VI film formed on the buffer layer; see, e.g., A. N. Tiwari, et al., "Heteroepitaxy of CdTe(100) on Si(100) Using $BaF_2$—$CaF_2$(100) Buffer Layers", *Journal of Crystal Growth*, Vol. 111, pp. 730–735 (1991). However, this approach is presently substantially inferior in crystalline quality to II-VI films deposited either on GaAs/Si or silicon.

Faurie and coworkers have deposited CdTe directly on silicon; see, e.g., R. Sporken, et al., "Current Status of Direct Growth of CdTe and HgCdTe on Silicon by Molecular Beam Epitaxy", *Journal of Vacuum Science and Technology*, B 10 pp. 1405–1409 (1992). However, the {111} orientation employed in their work has often resulted in extensive domain and lamellar twin formation that renders the material unreliable for use as alternative substrates in liquid phase epitaxy (LPE), molecular beam epitaxy (MBE), or metal organic chemical vapor deposition (MOCVD).

A discussion of the growth of CdZnTe layers on a GaAs buffer formed on a silicon substrate for large-area HgCdTe infra-red (IR) focal plane arrays (FPAs) is given by S. M. Johnson et al, "MOCVD Grown CdZnTe/GaAs/Si Substrates for Large-Area HgCdTe IRFPAs", 1992 *HgCdTe Workshop*, Boston, Mass., (Oct. 13–15, 1992). The drawback with using a substrate containing GaAs is that both Ga and As are electrically active dopants in HgCdTe and other II-VI materials. This creates a significant problem concerning the threat of contaminating an LPE HgCdTe melt with both Ga and As should a wafer fracture or uncontrolled etchback of the CdZnTe buffer layer occur. The melt would rapidly dissolve the exposed Ga and As, thus contaminating the melt. The threat of such a catastrophic event is a significant drawback to II-VI growth on GaAs-on-Si.

Further, silicon substrates with a buffer layer of GaAs are generally obtained from an outside vendor and cost approximately $2,000 (1993 dollars) for a 4-inch diameter wafer versus a cost of $20 for a comparable uncoated silicon wafer. Purchase of GaAs-on-Si substrates also requires reliance on the quality control protocols of two separate manufacturers—the silicon substrate supplier and GaAs epitaxial foundry.

Thus, a need remains for the formation of good quality ternary II-VI semiconductor films on a silicon substrate without the added complications imposed by the presence of an extraneous III-V interlayer.

SUMMARY OF THE INVENTION

In accordance with the invention, ternary II-VI semiconductor films are formed on a silicon substrate by depositing a monolayer of arsenic on a cleaned surface of the substrate. The ternary II-VI semiconductor film is then formed over the arsenic monolayer, either directly or on top of an intermediate II-VI semiconductor buffer layer.

The novelty of the present invention consists of the use of an arsenic passivating layer to facilitate the epitaxial deposition of technologically important II-VI semiconductors such as ZnTe, CdTe, and HgCdTe on silicon substrates of arbitrary crystallographic orientation. Prior attempts to deposit such films have relied on GaAs-on-Si composite substrates, which are expensive, difficult to prepare for epitaxy, and present potential III-V doping contaminants to HgCdTe epitaxy systems. Preparation of Si substrates with a simple monolayer of arsenic atoms enables subsequent high quality molecular beam epitaxy or metal-organic chemical vapor deposition growth of highly lattice-mismatched II-VI epitaxial films such as ZnTe, CdTe, HgZnTe, and HgCdTe without the complication of additional thick interlayers.

The present invention enables the deposition of good quality II-VI epitaxial films on silicon substrates without the complications of previously demonstrated methods employing less desirable intervening layers between the silicon substrate and the II-VI epitaxial film.

By purchasing the silicon substrates, rather than the very expensive GaAs-on-Si substrates, and doing a simple deposition of arsenic in-house, the need for any internal screening procedures designed to monitor the quality of the GaAs epitaxy can be obviated. Elimination of the GaAs layer is also an advantage because of the difficulty of properly removing the GaAs native oxide and preparing a stoichiometric GaAs semiconductor surface prior to molecular beam epitaxy (MBE) deposition of the II-VI film. The cleaning and surface preparation of uncoated silicon substrates has been found to be more straightforward and reproducible than is the case with GaAs/Si substrates. Finally, elimination of the GaAs layer simplifies the procedures for the alternative liquid phase epitaxial (LPE) growth and subsequent processing of HgCdTe on Si-based substrates, because of the elimination of any potential for Ga or As contamination.

DESCRIPTION OF THE PREFERRED EMBODIMENTS

It has been repeatedly demonstrated in Applicant's laboratory that epitaxial films of ZnTe and CdTe of {100} orientation directly grown on Si(100) with arsenic passivation are as good as or superior to those deposited either on GaAs-on-Si or directly on Si(100) with no passivation, in terms of crystalline perfection and surface morphology. II-VI films grown directly on Si(100) without passivation are frequently polycrystalline or exhibit poor crystallinity (R. Sporken, et al., supra), and hence are unacceptable as buffer layers for subsequent HgCdTe growth. CdTe films deposited on GaAs-on-Si exhibit crystalline perfection comparable to that of CdTe films deposited on As-passivated Si, but quite often the morphological quality, either from MOCVD (S. M. Johnson, et al., "Structural and Electrical Properties of Heteroepitaxial HgCdTe/CdZnTe/GaAs/Si", *Materials Research Society Symposium Proceedings*, Vol. 161, pp. 351–356 (1990) or MBE, is much worse than that which is routinely achieved with growth on As-passivated silicon. Given the approximate parity of the crystalline quality of II-VI films grown on GaAs-on-Si and on As-passivated Si, the reduction in substrate cost, the availability of larger substrates, and elimination of the threat of Ga and As contamination of II-VI epitaxy systems remain as the primary advantages of the technique of II-VI deposition on As-passivated Si.

It is noted that arsenic monolayers, formed on silicon substrates, have been used for the growth of ZnSe interlayers, on which GaAs layers are grown; see, e.g., R. D. Bringans et al, "Initial Stages of Growth of ZnSe on Si", *Materials Research Society Symposium Proceedings*, Vol. 242, pp. 191–202 (1992) and R. D. Bringans et al, "Effect of Interface Chemistry on the Growth of ZnSe on the Si(100) Surface", *Physical Review* B, Vol. 45, No. 23, pp. 13,400–13,406 (Jun. 15, 1992). However, there is no suggestion that ternary II-VI films may be grown either on ZnSe or directly on the arsenic layer.

Figure 1:
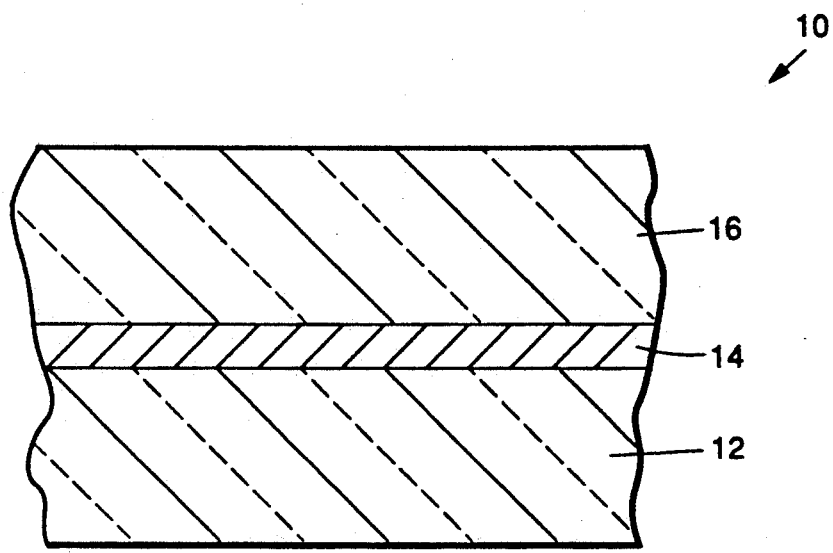
FIG. 1 is a cross-sectional view of a silicon substrate, having formed thereon an arsenic monolayer prior to the deposition of a II-IV semiconductor epilayer, in accordance with the invention.

FIG. 1 shows a schematic cross-section 10 of a multilayer stack of II-VI epitaxial films designed to function as a conventional infrared photovoltaic detector. The crucial first step in the process is the deposition on a silicon substrate 12 of a single monolayer 14 of arsenic, such as by MBE or MOCVD or perhaps through appropriate ex situ wet chemical treatment, prior to the initiation of II-VI epitaxy. The arsenic deposition procedure must be designed to deposit only a single monolayer of arsenic on an atomically clean Si surface; deposition of quantities of arsenic in excess of this is unacceptable and will disrupt the subsequent epitaxial processes. The epitaxial growth sequence must furthermore be designed to allow a single, uncontaminated monolayer of arsenic to remain on the silicon surface during the time period between the completion of the actual arsenic deposition and the commencement of II-VI layer deposition.

The arsenic monolayer 14 may be deposited by any of the conventional deposition processes known in the art, such as MBE, MOCVD, metal organic MBE (MOMBE), and gas source MBE (GSMBE), using elemental As or other As-containing precursors such as arsine or t-butyl arsine. Alternatively, a wet chemical process, executed immediately prior to loading the Si substrates into a II-VI epitaxial reactor, could be utilized to terminate the Si surface with As through chemical reactions in a liquid environment. Further, while the invention is described in terms of the deposition of an arsenic layer, the monolayer 14 may alternatively comprise other elements from Group V of the Periodic Table, specifically, phosphorus or antimony.

After the monolayer passivation of the silicon surface, the growth of II-VI epilayer, such as by MBE or MOCVD, can be initiated with one or more II-VI epilayers 16, as shown in FIG. 1. The sequence of II-VI epilayers 16 is typically grown to a total thickness ranging from about 10 to 15 $\mu$m for conventional IR detector structures. Devices are then formed in the top surface of the epilayer 16.

The II-VI epilayer 16 comprises any of the binary, ternary and quaternary II-VI semiconductor compounds, and preferably comprises binaries such as ZnTe, CdTe, CdSe, CdS, and ZnS, ternaries such as HgCdTe, HgZnTe, HgCdSe, HgZnSe, HgCdS, and HgZnS, and quaternaries such as ZnCdSeTe, ZnCdSSe, ZnCdSTe, HgCdZnTe, HgCdSeTe, and HgZnSeTe.

Figure 2:
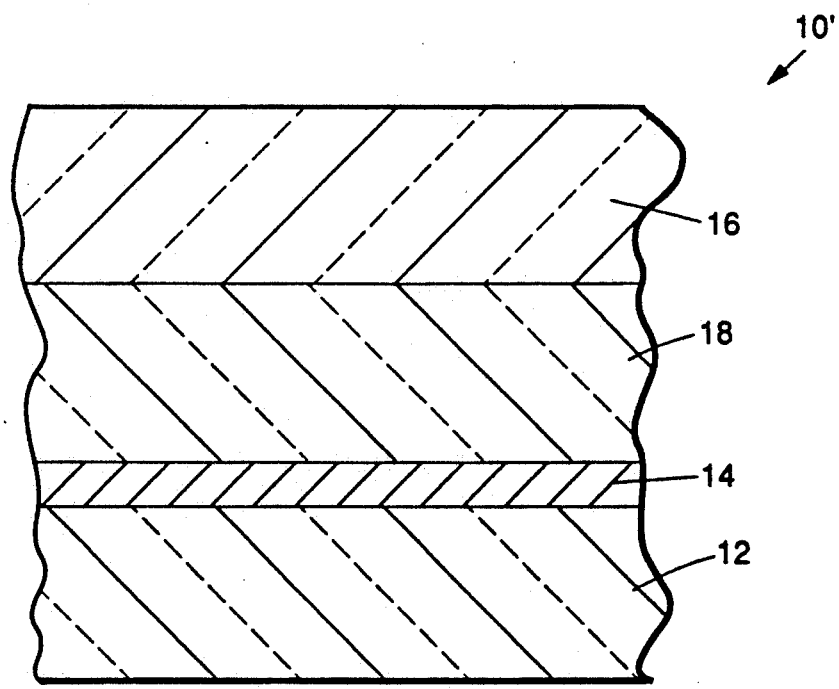
FIG. 2 is a cross-sectional view similar to that of FIG. 1, but showing a II-VI buffer layer interposed between the arsenic monolayer and the II-IV semiconductor epilayer, in accordance with the invention.

Alternatively, any sequence of II-VI buffer layers 18 (e.g., ZnTe/CdZnTe) may be deposited on the passivating monolayer 14, followed by growth of the II-VI epilayer 16 thereon, as shown in FIG. 2. The completed multilayer stack is denoted 10' in FIG. 2. The II-VI buffer layer 18 is grown to a thickness ranging from about 8 to 10 $\mu$m.

After completion of the deposition of the II-VI buffer layer 18, the final device structure comprises one or more II-VI epilayer layers 16, which can be grown by either LPE, MBE, or MOCVD.

The II-VI buffer layer 18, if employed, may comprise any of sulfur-, selenium-, or tellurium-containing binary II-VI compounds such as BeS, MgS, ZnS, CdS, HgS, MnS, BeTe, MgTe, ZnTe, CdTe, HgTe, CdSe, and ZnSe, and any of the ternary II-VI compounds, such as ZnSSe, ZnSTe, ZnSeTe, CdSSe, CdSTe, CdZnSe, CdZnTe, HgCdTe, HgZnTe, HgCdSe, and HgZnSe. Further, any combination of the foregoing binary and ternary compounds may be used in a multilayer stack to form the buffer layer 18.

Due to lattice mismatch considerations, preferred binaries include ZnTe, CdTe, CdSe, and CdS, while preferred ternaries include CdZnTe, CdSeTe, CdZnSe, and ZnTeSe.

Most preferably, the buffer layer as comprises a II-VI material having as low a microhardness as possible (relative to the final ternary II-VI device structure), since this would ensure that dislocations generated either during growth due to the lattice mismatch or those introduced during post-growth thermal annealing (LPE growth of HgCdTe typically takes the wafer to about 500° C.) would have the highest probability of confinement in the buffer layer. Inasmuch as the microhardness of ZnSe (1,350 N/mm$^2$) and of ZnS (1,780 N/mm$^2$) is substantially higher than that of ZnTe (900 N/mm$^2$), of CdTe (600 N/mm$^2$), and of HgTe (300 N/mm$^2$), then the latter compounds are preferred over the former compounds.

The As passivation 14 is crucial to facilitating the high quality deposition of the II-VI epilayer 16 or, if employed, the II-VI buffer layer 18, whose chemical identity could be quite broad. The technique of As passivation may furthermore be extended to Si substrate orientations other than {100}, such as {111} and {211}, which are also of technological importance.

There is a considerable lattice mismatch between the silicon substrate 12 and the II-VI layer (whether buffer layer 18 or epilayer 16). Without subscribing to any particular theory, it appears that arsenic serves two functions. First, it acts as a barrier to prevent spurious chemical reactions between Group VI species, such as Te, and the Si substrate that could potentially disrupt the epitaxial process. Second, a plane of Group VI atoms has the correct chemical valence for full chemical coordination between a plane of Group IV atoms and a plane of Group II atoms from a II-VI compound, which serves to ensure the chemical stability of the interface. There are certainly lattice defects such as threading dislocations generated at the Si/As/II-VI interface, but the II-VI epilayer 16 and the II-VI buffer layer 18 are designed to be thick enough to allow threading dislocations to be annihilated before the functioning device region (not shown).

The present invention has been reduced to practice using a composite buffer layer consisting of CdZnTe and ZnTe grown on As-passivated Si(100). Specifically, a buffer layer 18 consisting of 1 μm of ZnTe followed by 9 μm of CdZnTe was deposited by MBE on a silicon substrate 12 passivated with an arsenic monolayer 14. As is well-known, the thin ZnTe layer acts to ensure (100)-oriented growth of the CdZnTe layer. Subsequently, a HgCdTe epilayer 16 was deposited by LPE on this CdZnTe/ZnTe/As/Si structure. Using X-ray diffraction rocking curve analysis, a rocking curve of the HgCdTe was obtained having a value of full-width at half-maximum (FWHM) of less than 60 arc seconds, which compares favorably with 70 to 110 arc seconds generally obtained for HgCdTe deposited on CdZnTe/ZnTe/GaAs/Si substrates. In addition, the surface morphology of such buffer layers on As-passivated silicon was superior to that which is generally obtained on GaAs-on-Si. Preliminary etch pit density measurements indicated comparable threading dislocation densities of 2 to $3 \times 10^5$ cm$^{-2}$ in CdZnTe buffer layers grown on both As-passivated Si and GaAs-on-Si.

In addition, a 3 μm layer of ZnTe has been grown on As-passivated Si(211). Since the (211) orientation is the preferred orientation for the growth of HgCdTe by MBE, this result suggests that HgCdTe(211) can be epitaxially grown on Si(211).

The present invention is expected to have an economic impact on efforts to produce large area infrared focal-plane arrays (FPAs) on alternative substrates. It is desirable to use Si-based substrates rather than bulk CdZnTe substrates for large area FPA fabrication because of wafer material and processing cost savings and to improve the thermal cycle reliability of indium bump bonds used to hybridize FPAs to silicon readout chips. Among Si-based alternative substrates, cost can be reduced approximately one hundred-fold, from $2000/GaAs-on-Si wafer to $20/Si wafer for 4-inch substrates, and the cost of substrate quality screening can also be expected to drop substantially.

This approach to alternative substrate preparation is also compatible with existing MBE ultra high vacuum (UHV) technology, requiring no changes in pumping packages, source design, etc. In addition, the technique of As passivation as disclosed herein with an elemental As source can easily be incorporated into cluster tool-based manufacturing processes that rely upon interconnected UHV modules dedicated to individual process steps.

Thus, there has been disclosed an arsenic passivation structure on silicon for the epitaxial deposition of II-VI semiconductor films thereover. It will be readily appreciated by those skilled in the art that various changes and modifications of an obvious nature may be made, and all such changes and modifications fall within the scope of the invention, as defined by the appended claims.

What is claimed is:

1. A method of growing a ternary or quaternary II-VI semiconductor layer on a silicon substrate, comprising:
   (a) providing said silicon substrate having a major surface;
   (b) depositing a monolayer of a Group V element selected from the group consisting of arsenic, phosphorus, and antimony on said major surface of said silicon substrate; and
   (c) depositing said ternary or quaternary II-VI semiconductor layer over said Group V monolayer.

2. The method of claim 1 wherein said monolayer consists essentially of arsenic.

3. The method of claim 1 further including, subsequent to step (b), depositing a II-VI buffer layer on said Group V monolayer and then depositing said ternary or quaternary II-VI semiconductor compound on said buffer layer.

4. The method of claim 3 wherein said buffer layer comprises a binary or ternary II-VI buffer layer.

* * * * *